(12) United States Patent
Rotem et al.

(10) Patent No.: US 9,966,940 B2
(45) Date of Patent: May 8, 2018

(54) CHARGE-SAVING POWER-GATE APPARATUS AND METHOD

(75) Inventors: Shai Rotem, Haifa (IL); Norbert Unger, Braunschweig (DE); Michael Zelikson, Haifa (IL)

(73) Assignee: INTEL CORPORATION, Santa Clara, CA (US)

( * ) Notice: Subject to any disclaimer, the term of this patent is extended or adjusted under 35 U.S.C. 154(b) by 0 days. days.

(21) Appl. No.: 13/976,156

(22) PCT Filed: Sep. 23, 2011

(86) PCT No.: PCT/US2011/053144
§ 371 (c)(1),
(2), (4) Date: Jun. 26, 2013

(87) PCT Pub. No.: WO2013/043199
PCT Pub. Date: Mar. 28, 2013

(65) Prior Publication Data
US 2013/0293282 A1    Nov. 7, 2013

(51) Int. Cl.
*H03K 17/00*    (2006.01)
*H03K 17/687*    (2006.01)
(Continued)

(52) U.S. Cl.
CPC .......... *H03K 17/00* (2013.01); *H03K 17/687* (2013.01); *H03K 2217/0036* (2013.01); *H03K 2217/0063* (2013.01)

(58) Field of Classification Search
CPC .. H03K 17/00; H03K 17/687; H03K 19/0008; H03K 19/0016; G06F 1/26; G06F 1/3287
(Continued)

(56) References Cited

U.S. PATENT DOCUMENTS

| 7,486,108 B2 | 2/2009 | Kim et al. |
| 7,498,836 B1* | 3/2009 | Tuan ............................... 326/38 |

(Continued)

FOREIGN PATENT DOCUMENTS

KR    1020080014531 A    2/2008

OTHER PUBLICATIONS

International Preliminary Report on Patentability for PCT Application No. PCT/US2011/053144, dated Apr. 3, 2014 (7 pages).
(Continued)

*Primary Examiner* — Lincoln Donovan
*Assistant Examiner* — Colleen O Toole
(74) *Attorney, Agent, or Firm* — Schwabe, Williamson & Wyatt, P.C.

(57) ABSTRACT

A power-gate circuit includes a power-gate transistor operable to switch to decouple a first supply voltage from a second supply voltage during an idle mode, and to couple the first supply voltage to the second supply voltage during a full operational mode. Part of the charge stored at a gate terminal of the power-gate transistor, would have been otherwise flushed to ground while turning on the power-gate transistor, is routed to the rail of the second supply voltage of the logic block. Part of the charge on the rail of the second supply voltage is used to charge the gate terminal of the power-gate transistor to deactivate the power-gate transistor if the logic block goes to the idle mode. Energy is saved both ways because of the charge recycling and the ability to use the power gate circuit even in cases where the duration of the idle mode may be short.

17 Claims, 3 Drawing Sheets

(51) Int. Cl.
*G06F 1/32* (2006.01)
*G06F 1/26* (2006.01)
*H03K 19/00* (2006.01)

(58) Field of Classification Search
USPC .......................................................... 327/541
See application file for complete search history.

(56) References Cited

U.S. PATENT DOCUMENTS

| | | | |
|---|---|---|---|
| 7,902,914 B2* | 3/2011 | Kawasaki | ..................... 327/544 |
| 2008/0082876 A1 | 4/2008 | Yu et al. | |
| 2008/0284504 A1* | 11/2008 | Hirota et al. | ................. 327/544 |
| 2009/0146734 A1 | 6/2009 | Farzan et al. | |
| 2011/0047397 A1 | 2/2011 | Ki-Jong | |

OTHER PUBLICATIONS

International Search Report and Written Opinion dated Apr. 26, 2012 for International Application No. PCT/US2011/053144, 10 pages.
Office Action dated Dec. 18, 2015 for German Application No. 112011105644.3, 10 pages.
Office Action dated May 11, 2015 for Taiwan Patent Application No. 101132363, 8 pages.
Office Action dated Sep. 6, 2016 for Taiwan Patent Application No. 104132541, 8 pages.
Khannah et al., "Stepped Supply Voltage Switching for Energy Constrained Systems," Int'l Symposium on Quality Electronic Design, Mar. 2011, 6 pages.
Kim et al., "Reducing Ground-Bounce Noise and Stabilizing the Data-Retention Voltage of Power-Gating Structures," IEEE, Transactions on Electronic Devices, vol. 55, No. 1, Jan. 2008, pp. 197-205.
Mutoh et al., "A 1 V multi-threshold voltage CMOS DSP with an efficient power management technique for mobile phone application," IEEE, Int'l Solid State Circuits Conference, Feb. 9, 1996, 3 pages.
Pakbaznia et al., "Charge Recycling in Power-Gated CMOS Circuits," IEEE, Transactions on Computer-Aided Design of Integrated Circuits and Systems, vol. 27, No. 10, Oct. 2008, pp. 1798-1811.
Yin et al., "Integrated Results for Dual Low Voltage IC Based High and Low Side Gate Drive," IEEE, Applied Power Electronics Conference and Exposition, vol. 2, 2005, pp. 759-765.

* cited by examiner

CHARGE-SAVING POWER-GATE APPARATUS AND METHOD

CROSS REFERENCE TO RELATED APPLICATION

The present application is a national phase entry under 35 U.S.C. § 371 of International Application No. PCT/US2011/053144, filed Sep. 23, 2011, entitled "CHARGE-SAVING POWER-GATE APPARATUS AND METHOD," which designates, among the various States, the United States of America, and the entire contents and disclosures of which are hereby incorporated by reference in their entireties.

TECHNICAL FIELD

This disclosure relates generally to electronic circuits. More particularly but not exclusively, the present disclosure relates to a power-gate circuit.

BACKGROUND INFORMATION

Power-gating techniques generally involve shutting off or reducing voltage that is supplied to certain electronic circuit component(s) when such electronic component(s) are not in use, such as in a sleep or standby mode or otherwise idle mode.

Some power-gating techniques provide a transistor between a main power network (such as a Vcc supply voltage) and the power network (VccG or gated Vcc supply voltage) of a logic block or other load having the electronic component(s). The transistor operates as a power-gate transistor, such that the power-gate transistor operates as a switch that couples the Vcc supply voltage to the VccG supply voltage during a full/normal operational mode to thereby provide the Vcc voltage level to the logic block, and the transistor decouples the Vcc supply voltage from the VccG supply voltage during the idle mode to thereby reduce power consumption or leakage current consumption.

However, the power-gate transistor is often large in size, and so switching the power-gate transistor OFF (to decouple the Vcc supply voltage from the VccG supply voltage) and ON (to couple the Vcc supply voltage to the VccG supply voltage) consumes energy itself. Accordingly, if the idle mode is short in time duration and the power-gate transistor is turned OFF for a short period of time (during the idle mode) and then turned ON again, the energy consumed for turning the power-gate transistor OFF and ON may be larger than the leakage current savings. To reduce the energy consumption, some conventional power-gating techniques refrain from using the power-gate transistor during short idle periods.

Hence, switching power-gate transistors OFF and ON may reduce their efficiency and limit their usage.

BRIEF DESCRIPTION OF THE DRAWINGS

Non-limiting and non-exhaustive embodiments are described with reference to the following figures, wherein like reference numerals refer to like parts throughout the various views unless otherwise specified.

DETAILED DESCRIPTION

Figure 1:
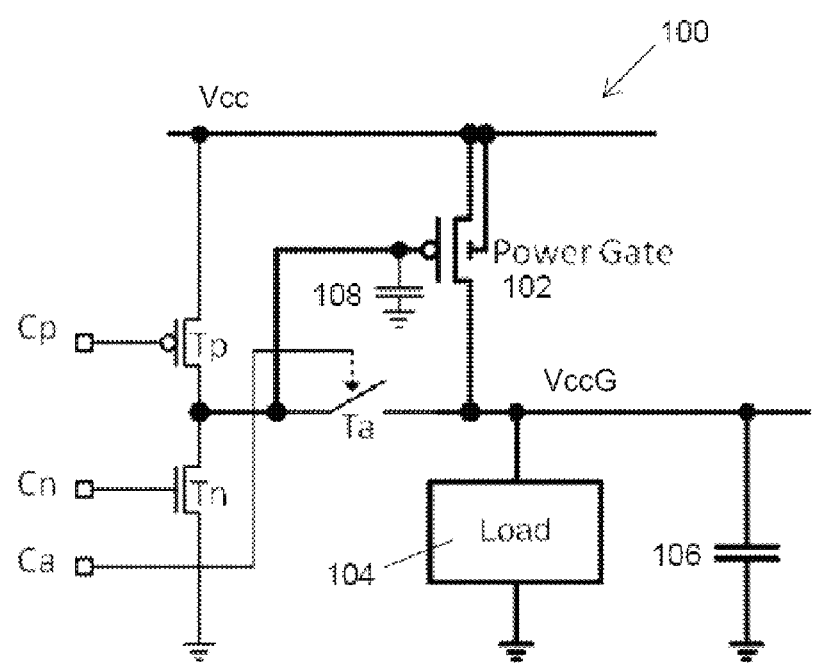
FIG. 1 illustrates a power-gate circuit having a power-gate transistor in accordance with one embodiment.

Embodiments of a method and apparatus to provide power-gating capability are described herein. In the following description, numerous specific details are given to provide a thorough understanding of embodiments. The embodiments can be practiced without one or more of the specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

One embodiment provides a power-gate circuit that includes a power-gate transistor operable to switch to decouple a first supply voltage from a second supply voltage during an idle mode, and to couple the first supply voltage to the second supply voltage during a full operational mode. Part of the charge stored at a gate terminal of the power-gate transistor, would have been otherwise flushed to ground while turning ON the power-gate transistor, is routed to the rail of the second supply voltage of the logic block. While turning OFF the power-gate transistor, part of the charge on the rail of the second supply voltage is used to charge the gate terminal of the power-gate transistor to deactivate the power-gate transistor if the logic block goes to the idle mode. Energy is saved both ways because of the charge recycling, which enables the usage of the power-gate circuit even in cases where the duration of the idle mode may be short.

On embodiment provides an apparatus that includes a power-gate transistor configured to transition to a first state to decouple a first supply voltage from a second supply voltage, and configured to transition to a second state to couple the first supply voltage to the second supply voltage; and a switch coupled to a control terminal of the power-gate transistor and to the second supply voltage; wherein for the first state, the switch is responsive to a signal to close and then responsive to the signal to open; and wherein for the second state, the switch is responsive to the signal to close and then responsive to the signal to open.

According to one embodiment of the apparatus, for the first state, the switch is responsive to the signal to close to enable charge to flow from the second supply voltage to the control terminal of the power-gate transistor; and for the second state, the switch is responsive to the signal to close to enable charge to flow from the control terminal of the power-gate transistor to the second supply voltage.

According to one embodiment of the apparatus, the power-gate transistor includes a P-type transistor.

According to one embodiment of the apparatus, the power-gate transistor has a first terminal coupled to the first supply voltage, a second terminal coupled to the second supply voltage, and a third terminal which is the control terminal.

According to one embodiment, the apparatus further includes: a first transistor having a first terminal coupled to the first supply voltage, a second terminal coupled to the third terminal of the power-gate transistor, and a third terminal coupled to receive a first signal; and a second transistor having a first terminal coupled to the second terminal of the first transistor and to the third terminal of the power-gate transistor, a second terminal coupled to ground, and a third terminal coupled to receive a second signal.

According to one embodiment of the apparatus, the signal that the switch is responsive to is a third signal; wherein for the first state at a first time, the second signal transitions from a first level to a second level to deactivate the second transistor, and the third signal transitions from the second level to the first level to close the switch; wherein for the first state at a second time after the first time, the third signal transitions from the first level to the second level to open the switch, and the first signal transitions from the first level to the second level to activate the first transistor and to keep the power-gate transistor deactivated to maintain the first supply voltage decoupled from the second supply voltage; wherein for the second state at a third time, the first signal transitions from the second level to the first level to deactivate the first transistor, and the third signal transitions from the second level to the first level to close the switch; and wherein for the second state at a fourth time after the third time, the third signal transitions from the first level to the second level to open the switch, and the second signal transitions from the second level to the first level to activate the second transistor and to keep the power-gate transistor activated to maintain the first supply voltage coupled to the second supply voltage.

According to one embodiment of the apparatus, the first, second, and third signals include voltage signals, and the first level is a higher voltage level relative to the second level.

According to one embodiment of the apparatus, the first transistor includes a P-type transistor and the second transistor includes a N-type transistor.

Another embodiment provides a method that includes: transitioning a power-gate transistor of a power-gate circuit to a first state to decouple a first supply voltage from a second supply voltage; transitioning the power-gate transistor to a second state to couple the first supply voltage to the second supply voltage; and operating a switch coupled between a control terminal of the power-gate transistor and the second supply voltage; wherein operating, for the first state and for the second state, includes the switch being responsive to a signal to close to enable charge to flow between the second supply voltage and the control terminal of the power-gate transistor and then responsive to the signal to open.

According to one embodiment of the method, operating, for the first state, includes the switch being responsive to the signal to close to enable the charge to flow from the second supply voltage to the control terminal of the power-gate transistor; and operating, for the second state, includes the switch being responsive to the signal to close to enable the charge to flow from the control terminal of the power-gate transistor to the second supply voltage.

According to one embodiment of the method, transitioning the power-gate transistor to the first state includes deactivating a P-type transistor so as to operate as an open circuit between the first supply voltage and the second supply voltage, and transitioning the power-gate transistor to the second state includes activating the P-type transistor so as to operate as short circuit between the first supply voltage and the second supply voltage.

According to one embodiment of the method, the power-gate circuit includes a first transistor controlled by a first signal and a second transistor controlled by a second signal, and the signal that the switch is response to is a third signal, and the method further includes: for the first state at a first time, transitioning the second signal from a first level to a second level to deactivate the second transistor, and transitioning the third signal from the second level to the first level to close the switch; for the first state at a second time after the first time, transitioning the third signal from the first level to the second level to open the switch, and transitioning the first signal from the first level to the second level to activate the first transistor and to keep the power-gate transistor deactivated to maintain the first supply voltage decoupled from the second supply voltage; for the second state at a third time, transitioning the first signal from the second level to the first level to deactivate the first transistor, and transitioning the third signal from the second level to the first level to close the switch; and for the second state at a fourth time after the third time, transitioning the third signal from the first level to the second level to open the switch, and transitioning the second signal from the second level to the first level to activate the second transistor and to keep the power-gate transistor activated to maintain the first supply voltage coupled to the second supply voltage.

According to one embodiment of the method, the first, second, and third signals include voltage signals, and the first level is a higher voltage level relative to the second level.

Still another embodiment provides a system that includes: a load; a power-gate circuit coupled to the load, and having at least one power-gate transistor configured to transition to a first state associated with an idle mode of the load to decouple a first supply voltage from a second supply voltage during the idle mode, the power-gate transistor being configured to transition to a second state associated with a full operational mode of the load to couple the first supply voltage to the second supply voltage during the full operational mode; and a switch coupled to a control terminal of the power-gate transistor and to the second supply voltage; wherein for the first state, the switch is responsive to a signal to close to enable charge to flow; and wherein for the second state, the switch is responsive to the signal to close to enable charge to flow.

According to one embodiment of the system, the load includes an electronic component of a mobile device.

According to one embodiment of the system, the load includes a portion of an integrated circuit.

According to one embodiment, the system further includes a finite state machine or counter configured to control generation of the signal to control operation of the switch.

According to one embodiment, the system further includes a self-timed circuit coupled to the power-gate circuit and configured to control the duration of the signal to keep the switch closed.

According to one embodiment of the system, the power-gate transistor includes a N-type transistor.

FIG. 1 illustrates a power-gate circuit 100 in accordance with one embodiment. The power-gate circuit 100 may include at least one power-gate transistor 102 placed between a first supply voltage (such as a Vcc supply voltage or Vcc rail) and a second supply voltage (such as a gated VccG supply voltage or VccG rail) that in one embodiment can be brought to a lower voltage level or potential relative to the first supply voltage.

In one embodiment, the power-gate transistor 102 can comprise a P-type metal oxide semiconductor field effect transistor (PMOSFET or PFET). The power-gate transistor 102 has a first terminal (such as a source terminal) coupled to the Vcc supply voltage and has a second terminal (such as a drain terminal) coupled to the VccG supply voltage.

A load 104 is coupled to the VccG supply voltage to receive voltage therefrom. The load 104 can comprise a logic circuit, a microprocessor, or other type of electronic component(s) that can enter a sleep or standby mode or otherwise idle mode. A capacitor 106 may represent a parasitic capacitance between the supply voltage VccG and ground. Alternatively or additionally, the capacitor 106 may be an actual circuit element coupled in parallel to the load 104, with a first terminal coupled to the VccG supply voltage and a second terminal coupled to ground.

If the power-gate transistor 102 is ON (e.g., the power-gate transistor 102 is activated to operate as a short circuit), the supply voltage Vcc is coupled to the supply voltage VccG, thereby bringing the supply voltage VccG to the same level or potential as the supply voltage Vcc during full/normal operation. In this full/normal operation, the load 104 receives the full or close to the full supply voltage Vcc. If the power-gate transistor 102 is OFF (e.g., the power-gate transistor 102 is deactivated so as to operate as an open circuit) during the idle mode, the supply voltage Vcc is decoupled from the supply voltage VccG.

Whether the power-gate transistor 102 is turned ON or OFF is based on a binary high or low level of a signal provided to its third terminal (such as a control terminal or a gate terminal). The signals and sequences used to turn the power-gate transistor OFF and ON will be described later below. A capacitor 108 may represent a parasitic capacitance between the gate terminal of the power-gate transistor 102 and ground. Alternatively or additionally, the capacitor 108 may be an actual circuit element coupled to the gate terminal, with a first terminal coupled to the gate terminal of the power-gate transistor 102 and a second terminal coupled to ground.

In one embodiment, the power-gate transistor 102 may be a large transistor. The large size may be embodied, for example, by a transistor having a large width. For the sake of simplicity of explanation, the power-gate transistor 102 will be described hereinafter in the context of being a P-type transistor to couple/decouple the Vcc and VccG supply voltages. In other embodiments, the power-gate transistor 102 may be an N-type transistor (such as an NMOSFET or NFET) to couple/decouple Vss and VssG supply voltages.

If the power-gate transistor 102 is implemented by a PFET, the power-gate transistor 102 may be coupled on the Vcc side of the supply current path (sometimes referred to as a "header" with the power-gate transistor 102 being a "header switch") of the load 104. If the power-gate transistor 102 is implemented by a NFET, the power-gate transistor 102 may be coupled on the Vss side of the supply current path (sometimes referred to as a "footer" with the power-gate transistor 102 being a "footer switch") of the load 104. In both cases according to various embodiments, energy or charge may be at least partially used/reused from VccG in a header switch configuration or from VssG in a footer switch implementation.

The power-gate circuit 100 further comprises a first transistor Tp, a second transistor Tn, and a switch Ta (which may be embodied as one or more transistors or other suitable switching device). In one embodiment that will be described herein, the first transistor Tp may comprise a PFET, while the second transistor Tn may comprise a NFET. In other embodiments, other types of transistors and/or conductivity types (N-type or P-type) may be provided. For the sake of simplicity of explanation herein, the first transistor Tp will be described in the context of a PFET, while the second transistor Tn will be described in the context of a NFET.

The first transistor Tp has a first terminal (such as a source terminal) coupled to the Vcc supply voltage and has a second terminal (such as a drain terminal) coupled to a first terminal (such as a drain terminal) of the second transistor Tn. A second terminal (such as a source terminal) of the second transistor Tn may be coupled to ground.

The second terminal of the first transistor Tp and the first terminal of the second transistor Tn may in turn be coupled to the gate terminal of the power-gate transistor 102, and to a first terminal of the switch Ta. The first terminal of the switch Ta may be coupled to the gate terminal of the power-gate transistor 102. A second terminal of the switch Ta may in turn be coupled to the VccG supply voltage that is coupled to the load 104.

The first transistor Tp has a third terminal (such as a control terminal or a gate terminal) coupled to receive a signal Cp. The second transistor Tn has a third terminal (such as a control terminal or a gate terminal) coupled to receive a signal Cn. The switch Ta is controlled by a signal Ca. In one embodiment, the signals Cp, Cn, and Ca may comprise voltage signals that may have binary high or low levels (to respectively provide binary 1 and binary 0). Furthermore in an embodiment, any one or more of the signals Cp, Cn, and Ca can be output signals of one or more drivers whose last stage may include an inverter. Still further in one embodiment, a self-timed circuit or other control circuit may be used to generate the signal Ca to control the switch Ta. For example, the self-timed circuit may be used to control the duration of the high binary level and/or low binary level of the third signal Ca, so as to control the duration of the open/close states of the switch Ta.

In one embodiment and as will be evident from the description that follows below, part of the charge stored at the gate terminal of the power-gate transistor 102, which would otherwise been flushed to ground while turning ON the power-gate transistor 102 (to operate the power-gate transistor 102 as a short circuit), is routed to the VccG supply voltage of the load 104. Vice versa, part of the charge on the VccG supply voltage is routed to the gate terminal of the power-gate transistor 102 to be used for charging the gate terminal of the power-gate transistor 102 and for turning the power-gate transistor 102 OFF (to operate the power-gate transistor 102 as an open circuit) if the load 104 goes to the idle mode. Energy is saved both ways because of the charge recycling and the ability to use the power-gate transistor 102 even in cases where the idle mode is short in time duration.

In one embodiment, the routing of the charge is done by using the switch Ta to couple the gate terminal of the power-gate transistor 102 to the VccG supply voltage. If the load 104 enters the idle mode, the switch Ta is used to route charge from the VccG supply voltage to the gate terminal of the power-gate transistor 102. If the load 104 exits idle mode to enter the full/normal operational mode, the switch Ta is used to route charge from the gate terminal of the power-gate transistor 102 to the VccG supply voltage.

Figure 2:
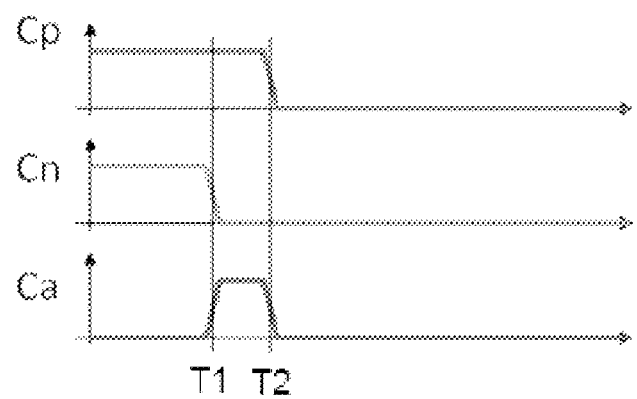
FIG. 2 illustrates signal diagrams associated with a first state of the power-gate transistor in accordance with one embodiment.

FIG. 2 illustrates timing diagrams of a first signal Cp to control the first transistor Tp, a second signal Cn to control the second transistor Tn, and a third signal Ca to control the switch Ta, with such timing diagrams associated with a first state of the power-gate transistor 102 in accordance with one embodiment. The signals Cp, Cn, and Ca may be voltage signals in one embodiment. For the first state shown in FIG. 2, the power-gate transistor 102 is turned OFF to decouple the Vcc supply voltage from the VccG supply voltage, such as during an idle mode.

Figure 3:
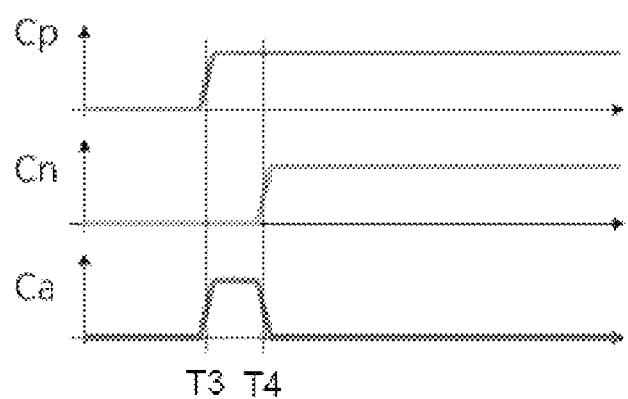
FIG. 3 illustrates signal diagrams associated with a second state of the power-gate transistor in accordance with one embodiment.

FIG. 3 illustrates timing diagrams of the signals Cp, Cn, and Ca associated with a second state of the power-gate transistor 102 in accordance with one embodiment. In the second state, the power-gate transistor 102 is turned ON to couple the Vcc supply voltage to the VccG supply voltage, such as during a full/normal operation mode when a full level voltage Vcc (or otherwise higher level voltage relative to the lower-level VccG supply voltage) is provided to the load 104.

Operation of the power-gate circuit 100 will now be described with reference to FIGS. 2-3 in conjunction with FIG. 1. In the description that follows, the signals Cp, Cn, and Ca will be described in the context of transitioning from a first level of voltage to a second level voltage (such as from low to high, or high to low). Hence, in one embodiment for example, the first level may a higher voltage level relative to the second level to turn OFF (deactivate) or turn ON (activate) certain transistors that are shown in FIG. 1. Such operational description is based on the logic of the particular configuration of the P-type and N-type devices shown in FIG. 1, and a different logic of the operation will be apparent from the present description if other configurations of P-type and N-type devices are used in other embodiments.

Referring first to FIGS. 1 and 2, if the power-gate transistor 102 is to be turned OFF (so as to operate as an open circuit that decouples the Vcc supply voltage from the VccG supply voltage), the second signal Cn first goes from high to low at approximately time T1 in order to turn OFF the second transistor Tn (the second transistor Tn operates as an open circuit). Meanwhile, the first signal Cp is high such that the first transistor Cp is OFF (so as to operate as an open circuit).

Then, the third signal Ca goes from low to high at approximately time T1 to close the switch Ta (the transistor of Ta turns ON in response to the third signal going high so as to operate as a short circuit), thereby enabling charge to flow from the VccG supply voltage to the gate terminal of the power-gate transistor 102. After a controlled time in one embodiment, the third signal Ca goes low (the switch Ta opens) at approximately time T2, and the first signal Cp goes from high to low to turn ON the first transistor Tp (so as to operate as a short circuit and thus provide the Vcc supply voltage to the gate terminal of the power-gate transistor 102) to keep the power-gate transistor 102 turned OFF (such that the power-gate transistor 102 is maintained as an open circuit).

Referring next to FIGS. 1 and 3, if the power-gate transistor 102 is to be turned ON (so as to operate as a short circuit that couples the Vcc supply voltage to the VccG supply voltage to bring the VccG supply voltage to approximately the same level as the Vcc supply voltage), the first signal Cp first goes from low to high at approximately time T3 in order to turn OFF the first transistor Tp (so as to operate as an open circuit). Meanwhile, the second signal Cn is low such that the second transistor Cn is OFF (so as to operate as an open circuit).

Then, the third signal Ca goes from low to high at approximately time T3 to close the switch Ta (the transistor of Ta turns ON in response to the third signal going high so as to operate as a short circuit), thereby enabling charge to flow from the gate of the power-gate transistor 102 onto the VccG supply voltage (rail). After a controlled time in one embodiment, the third signal Ca goes low (the switch Ta opens) at approximately time T4, and the second signal Cn goes from low to high to turn ON the second transistor Tn (so as to operate as a short circuit to couple the gate terminal of the power-gate transistor 102 to ground) to keep the power-gate transistor 102 turned ON (such that the power-gate transistor 102 is maintained as a short circuit).

In one embodiment, the duration in which the third signal Ca signal is high (e.g., from time T1 to T2, and from time T3 to T4) can be controlled by a self-timed circuit in order to maximize the energy saving. Other methods can be used to generate and/or control generation of the third signal Ca that in turn controls the switch Ta, such as for example, using a finite state machine (FSM) to control generation of the third signal Ta according to the timing or condition in which the load 104 enters and exits an idle mode. As yet another example, generation of the third signal Ta may be controlled in one embodiment by a counter that uses a fixed number of clock cycles, with the number of cycles to be used by the counter able to be varied for instance by a central processing unit (CPU) or other processor and/or trained and stored somewhere in the system (see, e.g., FIG. 4).

In one embodiment, the duration in which the third signal Ca is kept high can be set to an operationally acceptable amount of time. The operationally acceptable amount of time can be based, for example, on a sufficient amount of time to keep the switch Ta close in order to enable a threshold amount of charge to be routed from one point to another. The amount of time can be set based on circuit requirements, circuit designer preference, and/or other factors including but not limited to an embodiment in which the switch Ta is not kept closed for too long a time period, so as to prevent current from starting to flow in the opposite direction, which can cause energy waste.

Figure 4:
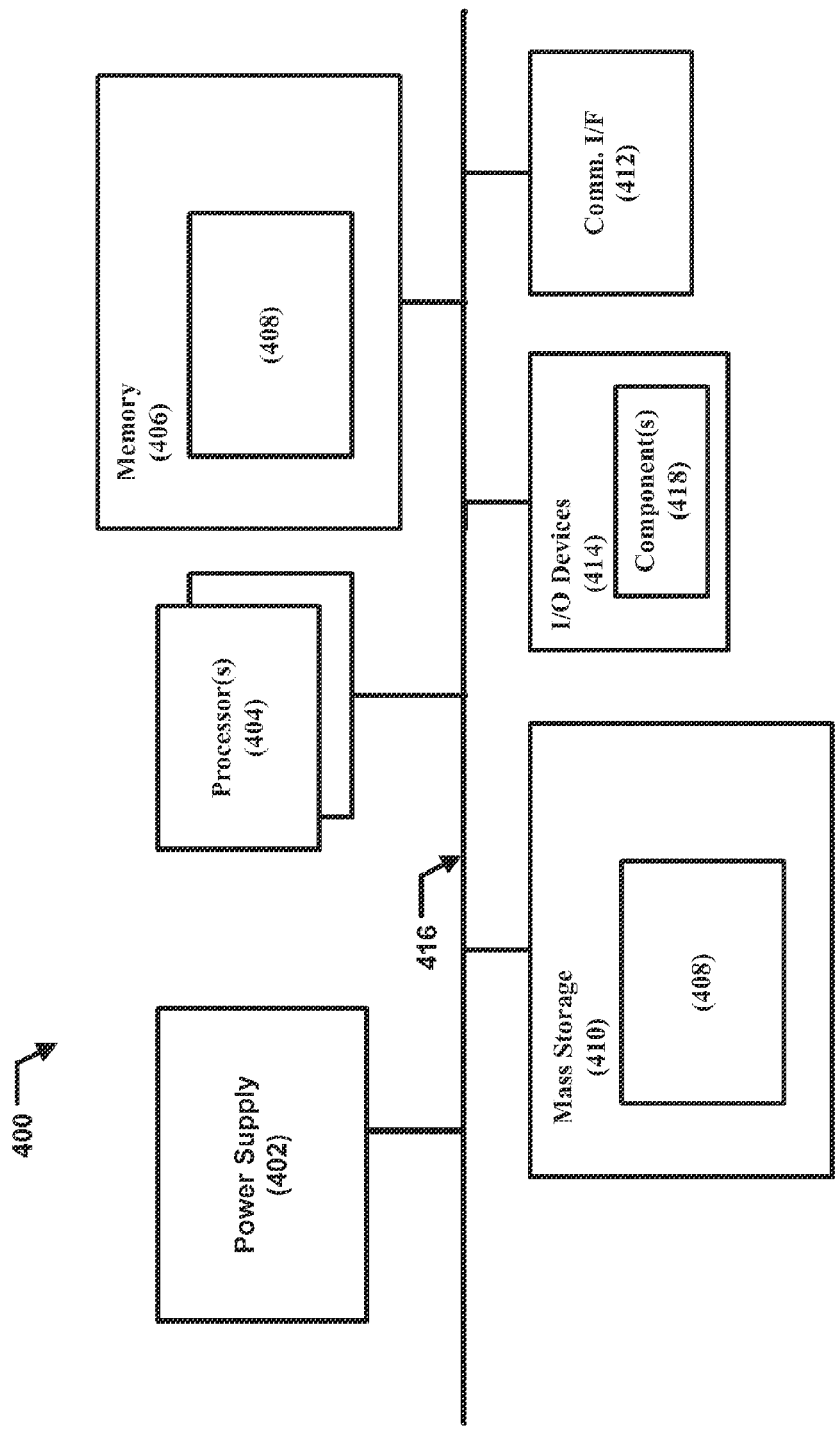
FIG. 4 is a block diagram that illustrates an example computer system suitable to practice the disclosed power-gate circuit/method of various embodiments.

Embodiments of the power-gate circuit 100 described herein may be used in a number of implementations and applications. For example, mobile devices, including but not limited to smart phones, nettops, tablets and other Mobile Internet Devices (MIDs), are designed with low-power circuitry. Also, microprocessors have low power states that may use power-gate techniques to prevent certain circuits or elements thereof from unnecessarily consuming power. FIG. 4 is a block diagram that illustrates an example computer system 400 suitable to practice the disclosed power-gate circuit/method of various embodiments.

As shown, the computer system 400 may include a power supply unit 402, a number of processors or processor cores 404, a system memory 406 having processor-readable and processor-executable instructions 408 stored therein, a mass storage device 410 that may also store the instructions 408, and a communication interface 412. For the purpose of this application, including the claims, the terms "processor" and "processor cores" may be considered synonymous, unless the context clearly requires otherwise.

In various embodiments of the present disclosure, at least one of the processors 404 or other component(s) in the system 400 may generate or cause to be generated any one or more of the signals Cp, Cn, or Ca having high or low states, in response to the particular state of the computer system 400, such as whether one or more circuits or elements thereof are to be placed in an idle mode.

The one or more mass storage devices 410 and/or the memory 406 may comprise a tangible, non-transitory computer-readable storage device (such as a diskette, hard drive, compact disc read only memory (CDROM), hardware storage unit, and so forth). The computer system 400 may also comprise input/output devices 414 (such as a keyboard, display screen, cursor control, and so forth). In various embodiments an purely by way of example, the I/O devices 414 may include electronic component(s) 418 (such as the load 104 of FIG. 1) that are to be power-gated and/or may itself comprise the power-gate circuit 100 described above. Such component(s) 418 may alternatively or additionally be located elsewhere in the computer system 400, and may comprise part or all of an integrated circuit. The load 104 of FIG. 1 may also be one of or part of the processor cores 404 that is getting power gated.

In some embodiments, the component(s) 418 can be separate or otherwise different from the load 104 and/or located elsewhere in the computer system 400. For example, the component(s) 418 may include the circuitry, such as drivers, the self-timed circuit, counter, FSM, or other(s) to control the duration of the third signal Ca to keep the switch Ta closed, or other circuitry associated with operation of the power-gate circuit 100.

The various elements of FIG. 4 may be coupled to each other via a system bus 416, which represents one or more buses. In the case of multiple buses, they may be bridged by one or more bus bridges (not shown). Data may pass through the system bus 416 through the I/O devices 414, for example, between the component(s) 418 and the processors 404.

The system memory 406 and the mass storage device 410 may be employed to store a working copy and a permanent copy of the programming instructions implementing one or more operating systems, firmware modules or drivers, applications, and so forth, herein collectively denoted as 408. The permanent copy of the programming instructions may be placed into permanent storage in the factory, or in the field, through, for example, a distribution medium (not shown), such as a compact disc (CD), or through the communication interface 412 (from a distribution server (not shown)).

According to various embodiments, one or more of the depicted components of the system 400 and/or other element(s) may include a keyboard, LCD screen, non-volatile memory port, multiple antennas, graphics processor, application processor, speakers, or other associated mobile device elements, including a camera.

The remaining constitution of the various elements of the computer system 400 is known, and accordingly will not be further described in detail.

The above description of illustrated embodiments, including what is described in the Abstract, is not intended to be exhaustive or to be limited to the precise forms disclosed. While specific embodiments and examples are described herein for illustrative purposes, various modifications are possible. For example, the configuration and connection of certain elements in various embodiments have been described above in the context of high/low values of signals, responses to rising/falling signals, P-type and N-type transistors, and so forth. In other embodiments, different configurations can be provided in view of whether N-type transistors are used instead of P-type transistors, whether or not certain signals are inverted, whether certain changes in state are triggered in response to falling edges instead of rising edges or vice versa, and so forth.

These and other modifications can be made in light of the above detailed description. The terms used in the following claims should not be construed to be limited to the specific embodiments disclosed in the specification.

What is claimed is:

1. An apparatus, comprising:
   a power-gate transistor configured to transition to a first state to decouple a first supply voltage from a second supply voltage, and configured to transition to a second state to couple the first supply voltage to the second supply voltage, wherein the power-gate transistor includes a control terminal, a first terminal coupled to the first supply voltage, and a second terminal coupled to the second supply voltage; and
   a switch transistor coupled between the control terminal of the power-gate transistor and the second supply voltage;
   wherein, to transition the power-gate transistor from the second state to the first state, the switch transistor is responsive to a signal to close for a first-pre-defined time period to transition the power-gate transistor to the first state, and then responsive to the signal to open after the first pre-defined time period, while the power-gate transistor remains in the first state; and
   wherein, to transition the power-gate transistor from the first state to the second state, the switch transistor is responsive to the signal to close for a second pre-defined time period to enable charge to flow from the control terminal of the power-gate transistor to the second supply voltage to transition the power-gate transistor to the second state and then responsive to the signal to open after the second pre-defined time period, while the power-gate transistor remains in the second state.

2. The apparatus of claim 1 wherein, to transition the power-gate transistor from the second state to the first state, the switch transistor is responsive to the signal to close to enable charge to flow from the second supply voltage to the control terminal of the power-gate transistor to transition the power-gate transistor to the first state.

3. The apparatus of claim 1 wherein the power-gate transistor includes a P-type transistor.

4. The apparatus of claim 1, further comprising:
   a first transistor having a first terminal coupled to the first supply voltage, a second terminal coupled to the control terminal of the power-gate transistor, and a third terminal coupled to receive a first control signal that is different from the signal to which the switch transistor is responsive; and
   a second transistor having a first terminal coupled to the second terminal of the first transistor and to the control terminal of the power-gate transistor, a second terminal coupled to ground, and a third terminal coupled to receive a second control signal that is different from the first control signal.

5. The apparatus of claim 4 wherein the signal to which the switch transistor is responsive is a third control signal;
   wherein, to transition the power-gate transistor from the second state to the first state:
   the second control signal transitions, at a first time, from a first level to a second level to deactivate the second transistor, and the third control signal transitions from the second level to the first level to close the switch transistor;
   the third control signal transitions, at a second time the first pre-defined time period after the first time, from the first level to the second level to open the switch transistor; and
   the first control signal transitions, at the second time, from the first level to the second level to activate the first transistor and to keep the power-gate transistor deactivated to maintain the first supply voltage decoupled from the second supply voltage; and wherein, to transition the power-gate transistor from the first state to the second state:
the first control signal transitions, at a third time, from the second level to the first level to deactivate the first transistor;
the third control signal transitions, at the third time, from the second level to the first level to close the switch transistor;
the third control signal transitions, at a fourth time the second pre-defined time period after the third time, from the first level to the second level to open the switch transistor; and
the second control signal transitions, at the fourth time, from the second level to the first level to activate the second transistor and to keep the power-gate transistor activated to maintain the first supply voltage coupled to the second supply voltage.

6. The apparatus of claim 5 wherein the first, second, and third control signals include voltage signals, and wherein the first level is a higher voltage level relative to the second level.

7. The apparatus of claim 4 wherein the first transistor includes a P-type transistor and wherein the second transistor includes an N-type transistor.

8. A method, comprising:
transitioning a power-gate transistor of a power-gate circuit to a first state to decouple a first supply voltage from a second supply voltage;
transitioning the power-gate transistor to a second state to couple the first supply voltage to the second supply voltage; and
operating a switch transistor coupled between a control terminal of the power-gate transistor and the second supply voltage;
wherein said operating, for transitioning the power-gate transistor to the first state, includes the switch transistor being responsive to a signal to close for a first pre-defined time period to enable charge to flow from the second supply voltage to the control terminal of the power-gate transistor to transition the power-gate transistor to the first state, and then responsive to the signal to open after the first pre-defined time period, while the power-gate transistor remains in the first state; and
wherein said operating, for transitioning the power-gate transistor to the second state, includes the switch transistor being responsive to a signal to close for a second pre-defined time period to enable charge to flow to the second supply voltage from the control terminal of the power-gate transistor to transition the power-gate transistor to the second state, and then responsive to the signal to open after the second pre-defined time period, while the power-gate transistor remains in the second state.

9. The method of claim 8 wherein said transitioning the power-gate transistor to the first state includes deactivating a P-type transistor so as to operate as an open circuit between the first supply voltage and the second supply voltage, and wherein said transitioning the power-gate transistor to the second state includes activating the P-type transistor so as to operate as a short circuit between the first supply voltage and the second supply voltage.

10. The method of claim 8 wherein the power-gate circuit includes a first transistor controlled by a first signal and a second transistor controlled by a second signal, and wherein the signal to which the switch transistor is responsive is a third signal, the method further comprising:
for transitioning the power-gate transistor to the first state:

at a first time, transitioning the second signal from a first level to a second level to deactivate the second transistor, and transitioning the third signal from the second level to the first level to close the switch transistor; and
at a second time the first pre-defined time period after the first time, transitioning the third signal from the first level to the second level to open the switch transistor, and transitioning the first signal from the first level to the second level to activate the first transistor and to keep the power-gate transistor deactivated to maintain the first supply voltage decoupled from the second supply voltage;
for transitioning the power-gate transistor to the second state:
at a third time, transitioning the first signal from the second level to the first level to deactivate the first transistor, and transitioning the third signal from the second level to the first level to close the switch transistor; and
at a fourth time the second pre-defined time period after the third time, transitioning the third signal from the first level to the second level to open the switch transistor, and transitioning the second signal from the second level to the first level to activate the second transistor and to keep the power-gate transistor activated to maintain the first supply voltage coupled to the second supply voltage.

11. The method of claim 10 wherein the first, second, and third signals include voltage signals, and wherein the first level is a higher voltage level relative to the second level.

12. A system, comprising:
a load;
a power-gate circuit coupled to the load, and having at least one power-gate transistor configured to transition to a first state associated with an idle mode of the load to decouple a first supply voltage from a second supply voltage during the idle mode,
wherein the power-gate transistor is configured to transition to a second state associated with a full operational mode of the load to couple the first supply voltage to the second supply voltage during the full operational mode; and
a switch transistor coupled to a control terminal of the power-gate transistor and to the second supply voltage,
wherein, to transition the power-gate transistor to the first state, the switch transistor is responsive to a signal to close for a first pre-defined period of time to enable charge to flow between the control terminal and the second supply voltage; and
wherein, to transition the power-gate transistor to the second state, the switch transistor is responsive to the signal to close for a second pre-defined period of time to enable charge to flow between the control terminal and the second supply voltage.

13. The system of claim 12 wherein the load includes an electronic component of a mobile device.

14. The system of claim 12 wherein the load includes a portion of an integrated circuit.

15. The system of claim 12, further comprising a finite state machine or counter configured to control generation of the signal to control operation of the switch transistor.

16. The system of claim 12, further comprising a self-timed circuit coupled to the power-gate circuit and configured to control a duration of the first pre-defined period of time and the second pre-defined period of time.

17. The system of claim 12 wherein the power-gate transistor includes an N-type transistor.

* * * * *